(12) United States Patent
Sawada et al.

(10) Patent No.: US 9,793,088 B2
(45) Date of Patent: Oct. 17, 2017

(54) TWO-STAGE DODECAPOLE ABERRATION CORRECTOR FOR CHARGED-PARTICLE BEAM

(75) Inventors: Hidetaka Sawada, Tokyo (JP); Yukihito Kondoh, Tokyo (JP)

(73) Assignee: JEOL Ltd., Tokyo (JP)

( * ) Notice: Subject to any disclaimer, the term of this patent is extended or adjusted under 35 U.S.C. 154(b) by 674 days.

(21) Appl. No.: 12/564,277

(22) Filed: Sep. 22, 2009

(65) Prior Publication Data

US 2010/0072387 A1    Mar. 25, 2010

(30) Foreign Application Priority Data

Sep. 24, 2008   (JP) .................................. 2008-244927

(51) Int. Cl.
  *H01J 37/26* (2006.01)
  *H01J 37/153* (2006.01)
(52) U.S. Cl.
  CPC ............ *H01J 37/153* (2013.01); *H01J 37/26* (2013.01); *H01J 2237/1532* (2013.01); *H01J 2237/1534* (2013.01)
(58) Field of Classification Search
  CPC .... H01J 3/12; H01J 29/566; H01J 2237/1534; H01J 37/153
  USPC ................. 250/396 R, 292, 396 ML
  See application file for complete search history.

(56) References Cited

U.S. PATENT DOCUMENTS

| | | | | |
|---|---|---|---|---|
| 4,962,309 A | * | 10/1990 | White et al. .............. | 250/396 R |
| 2002/0121609 A1 | * | 9/2002 | Hosokawa ............ | 250/396 ML |
| 2003/0043358 A1 | * | 3/2003 | Suganuma et al. ............. | 355/53 |
| 2004/0227099 A1 | * | 11/2004 | Matsuya ...................... | 250/398 |
| 2005/0029466 A1 | * | 2/2005 | Kawai et al. .............. | 250/396 R |
| 2006/0169900 A1 | * | 8/2006 | Noji et al. ..................... | 250/310 |
| 2007/0114403 A1 | * | 5/2007 | Hosokawa .................... | 250/310 |
| 2007/0114408 A1 | * | 5/2007 | Honda et al. ................. | 250/310 |
| 2007/0181806 A1 | * | 8/2007 | Nakano et al. .............. | 250/310 |
| 2007/0284524 A1 | * | 12/2007 | Franzen ........................ | 250/292 |
| 2008/0054186 A1 | * | 3/2008 | Hosokawa ............... | 250/396 R |
| 2009/0014649 A1 | * | 1/2009 | Nakasuji et al. ............ | 250/310 |
| 2010/0264335 A1 | * | 10/2010 | Hoyle et al. ............... | 250/492.3 |
| 2012/0056085 A1 | * | 3/2012 | Giles et al. ................... | 250/282 |

OTHER PUBLICATIONS

A.V.Crewe and D. Kopf, "A sextupole system for the correction of spherical aberration," Optik, vol. 55, No. 1 (1980), pp. 1-10.

(Continued)

*Primary Examiner* — Brooke Purinton
(74) *Attorney, Agent, or Firm* — The Webb Law Firm

(57) ABSTRACT

An aberration corrector has two stages of dodecapole (12-pole) elements each of which has first through twelfth poles arranged in this order. Exciting coils of the (4n+1)th poles and the exciting coils of the (4n+4)th poles are connected with a first reversible power supply in series (where n=0, 1, 2) to produce magnetic fields which are identical in absolute value but mutually opposite in sense relative to the optical axis within a plane perpendicular to the axis. The exciting coils of the (4n+3)th poles and the exciting coils of the (4n+2)th poles are connected with a second reversible power supply in series to produce magnetic fields which are identical in absolute value but mutually opposite in sense relative to the optical axis within the plane perpendicular to the axis.

6 Claims, 6 Drawing Sheets

(56) References Cited

OTHER PUBLICATIONS

H. Rose, "Outline of a spherically corrected semiaplanatic medium-voltage transmission electron microscope," Optik, vol. 85, No. 1 (1990), pp. 19-24.
Fumio Hosokawa et al., "Design and Development of Cs corrector for a 300 kV TEM and STEM," IMC16, Sapporo, 2006, p. 582.

* cited by examiner

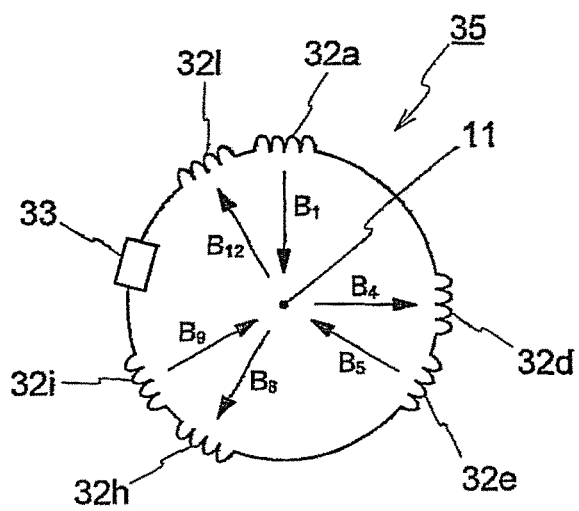
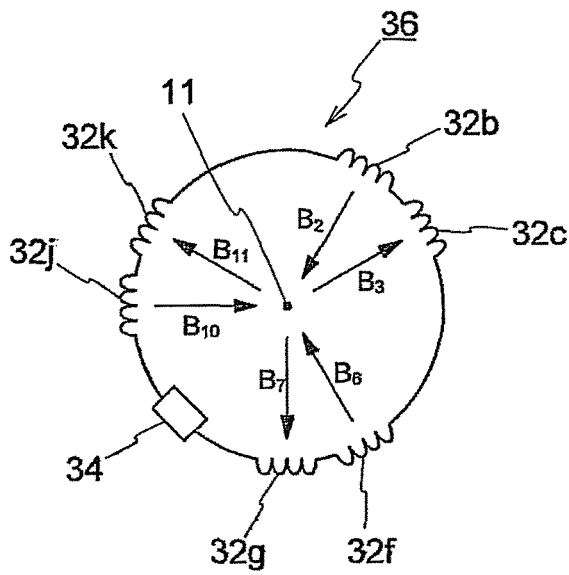
*FIG. 3a*     *FIG. 3b*
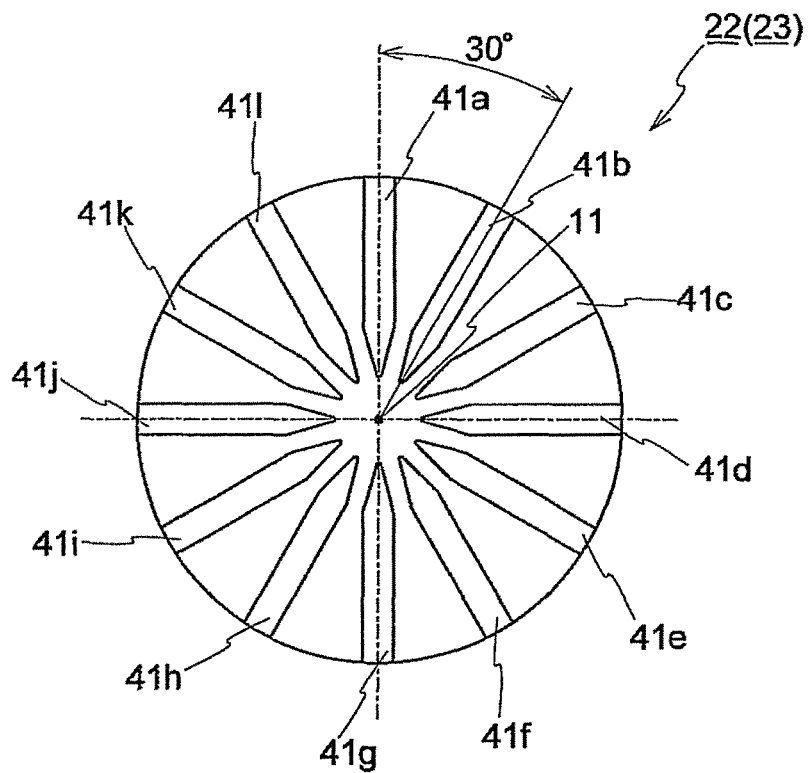
*FIG. 5*

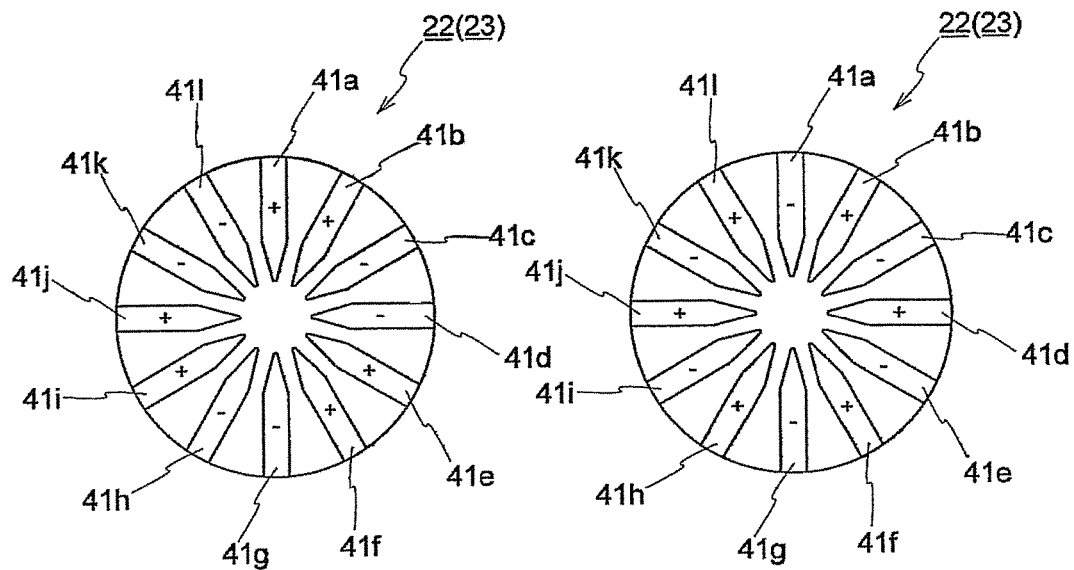
*FIG. 7a*     *FIG. 7b*
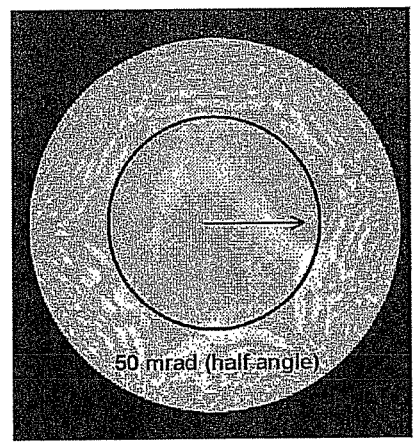
*FIG. 10*

TWO-STAGE DODECAPOLE ABERRATION CORRECTOR FOR CHARGED-PARTICLE BEAM

BACKGROUND OF THE INVENTION

Field of the Invention

The present invention relates to an aberration corrector and a charged-particle beam system. More particularly, the present invention relates to an aberration corrector for correcting spherical aberration and 6-fold astigmatism and to a charged-particle beam system equipped with this aberration corrector.

Description of Related Art

In a charged-particle beam system such as an electron microscope, a positive spherical aberration induced by an axisymmetric lens is an intrinsic factor limiting the spatial resolution.

Techniques for suppressing the effects of the positive spherical aberration are disclosed in the following documents: A. V. Crewe and D. Kopf, *Optik*, Vol. 55 (1980), pp. 1-10; H. Rose, *Optik*, Vol. 85 (1990), pp. 19-24; and F. Hosokawa et al., Proc. IMC 16 (2006), p. 582. In these techniques, two stages of multipole elements (such as hexapole elements) for producing a field of 3-fold symmetry are basically placed ahead or behind an axisymmetric lens (such as the objective lens of an electron microscope). Furthermore, transfer lenses are disposed between any two adjacent multipole elements. Further transfer lenses are placed between each multipole element and the axisymmetric lens. Each multipole element has a thickness along the optical axis and produces a 3-fold astigmatism and a negative spherical aberration. The rear stage of multipole element produces a 3-fold symmetric field to cancel out the 3-fold astigmatism produced by the front stage of multipole element. Thus, only a negative spherical aberration can be extracted from the two stages of multipole elements. Consequently, in the whole optical system including the axisymmetric lens, the spherical aberration is reduced.

However, the above-described aberration-correcting techniques correct aberrations only up to the fourth order and cannot achieve complete correction of still higher-order aberrations. For example, fifth-order spherical aberration can be corrected by optically controlling the distance between the objective lens and the aberration corrector but astigmatism of the same order (i.e., 6-fold astigmatism) cannot be corrected. Because this is a factor limiting aberration correction, it cannot be expected that the spatial resolution will be improved further.

An actual multipole element has a finite thickness along the optical axis. Where this multipole element produces a magnetic or electric field of 3-fold symmetry, if the spherical aberration is corrected by the multipole element, then higher-order aberrations dependent on the thickness are induced. Consequently, the range of incident angles of the electron beam that can be aberration-corrected is limited. Additionally, this limitation makes it difficult to reduce diffraction aberration.

This limitation on the angles is described by referring to the Ronchigram of FIG. 10. This diagram is obtained when an electron beam passing through a single stage of multipole element is corrected for aberrations, the multipole element producing a magnetic field of 3-fold symmetry with respect to the optical axis. A low-contrast region appearing in the center of the diagram corresponds to the angle of incidence of the electron beam on the multipole element, the beam being appropriately corrected for aberrations.

Where a maximum value of the angle of incidence is roughly calculated, a maximum circle centered at the central point of the region and including only the region is fitted. The angle of incidence of the electron beam is computed from the radius of the circle. It can be seen from the diagram of FIG. 10 that the maximum incident angle of the electron beam that has been appropriately corrected for aberrations is about 50 mrad.

However, where regions located around the circle are noticed, one can observe that the central region of low contrast is hexagonal, because 6-fold astigmatism appearing at the fifth-order aberration remains. In the case of the multipole element producing the diagram of FIG. 10, the angle of incidence of the electron beam that can be corrected for aberrations is 50 mrad at maximum. It is difficult to appropriately correct the electron beam having a greater angle of incidence for aberrations. Accordingly, if one tries to reduce diffraction aberration, the spatial resolution is limited due to the limitation on the angle of incidence.

The 6-fold astigmatism can be corrected by a dodecapole (12-pole) element where magnetic poles of N and S poles are alternately arranged. However, it is necessary to rotate the distribution of the magnetic field produced by the dodecapole element according to an image including the 6-fold astigmatism to be corrected. That is, the dodecapole element itself must be rotated. This is not a realistic solution. The rotation may be achieved using a 24-pole element but this element involves difficulties, such as low machining accuracy and low assembly accuracy. Furthermore, the coil that is necessary for correction of 6-fold astigmatism needs to have a number of turns of winding comparable to or greater than the number of turns of winding on the coil used for correction of spherical aberration. Where the coil of this design is installed on each pole to obtain a magnetic pole, it is very difficult to secure a space.

SUMMARY OF THE INVENTION

Accordingly, it is an object of the present invention to provide an aberration corrector which is adapted for use with a charged-particle beam system and which is simple in structure but can correct both spherical aberration and 6-fold astigmatism.

A first embodiment of the present invention provides an aberration corrector for correcting aberrations in a charged-particle beam. The corrector has two stages of dodecapole elements and exciting coils installed respectively at the poles of the dodecapole elements. Each dodecapole element has first through twelfth poles arranged in this order. It is assumed that an integer n can have a value from 0 to 2 (i.e., n=0, 1, 2). The exciting coils of the (4n+1)th pole and the exciting coils of the (4n+4)th pole are alternately connected in series and produce magnetic fields which are identical in absolute value but mutually opposite in sense relative to the optical axis within a plane perpendicular to the optical axis. The exciting coils of the (4n+3)th pole and the exciting coils of the (4n+2)th pole are alternately connected in series and produce magnetic fields which are identical in absolute value but mutually opposite in sense relative to the optical axis within the plane perpendicular to the optical axis. Consequently, a superimposition of magnetic fields of 3-fold symmetry and magnetic fields of 6-fold symmetry is produced.

A second embodiment of the present invention provides an aberration corrector which is based on the aberration corrector of the first embodiment and further characterized in that each pole of the dodecapole elements serves also as an electrode. Each dodecapole element has first through twelfth poles arranged in this order. It is assumed that an integer m can have a value from 0 to 2 (i.e., m=0, 1, 2). The (4m+1)th poles are all electrically connected. The (4m+2)th poles are all electrically connected. The (4m+3)th poles are all electrically connected. The (4m+4)th poles are all electrically connected. The (4m+1)th poles and the (4m+4)th poles produce electric fields which are identical in absolute value but mutually opposite in sense relative to the optical axis within the plane perpendicular to the optical axis. The (4m+2)th poles and the (4m+3)th poles produce electric fields which are identical in absolute value but mutually opposite in sense relative to the optical axis within the plane perpendicular to the axis. Consequently, a superimposition of electric fields of 3-fold symmetry and electric fields of 6-fold symmetry is produced.

A third embodiment of the present invention provides an aberration corrector for correcting aberrations in a charged-particle beam. The corrector has two stages of dodecapole elements. Each dodecapole element has first through twelfth poles arranged in this order. It is assumed that an integer s can have a value from 0 to 2 (i.e., s=0, 1, 2). The (4s+1)th poles are all electrically connected. The (4s+2)th poles are all electrically connected. The (4s+3)th poles are all electrically connected. The (4s+4)th poles are all electrically connected. The (4s+1)th poles and the (4s+4)th poles produce electric fields which are identical in absolute value but mutually opposite in sense relative to the optical axis within a plane perpendicular to the optical axis. The (4s+2)th poles and the (4s+3)th poles produce electric fields which are identical in absolute value but mutually opposite in sense relative to the optical axis within the plane perpendicular to the axis. Consequently, a superimposition of electric fields of 3-fold symmetry and electric fields of 6-fold symmetry is produced.

A fourth embodiment of the present invention provides a charged-particle beam system equipped with the aberration corrector of the first embodiment.

A fifth embodiment of the present invention provides a charged-particle beam system equipped with the aberration corrector of the second embodiment.

A sixth embodiment of the present invention provides a charged-particle beam system equipped with the aberration corrector of the third embodiment.

According to the present invention, spherical aberration and 6-fold astigmatism can be corrected at the same time with a simple structure. A probe having a wider angular aperture can be created. Therefore, diffraction aberration is reduced. A probe having a quite small diameter can be produced. Also, improved spatial resolution can be accomplished.

Other objects and features of the invention will appear in the course of the description thereof, which follows.

BRIEF DESCRIPTION OF THE DRAWINGS

FIGS. 3a and 3b show electric circuits associated with the first embodiment of the present invention;

FIGS. 4a, 4b, 4c, and 4d show diagrams showing the polarities of the poles of the dodecapole element associated with the first embodiment of the present invention when the dodecapole element is excited, and in which FIGS. 4a and 4c show cases where magnetic fields of 3-fold symmetry are produced and FIGS. 4b and 4d show cases where magnetic fields of 6-fold symmetry are produced;

FIG. 5 is a schematic representation of a dodecapole element associated with a second embodiment of the present invention;

FIGS. 7a and 7b show diagrams showing the polarities of the poles of the dodecapole element associated with the second embodiment of the present invention when voltages are applied to the dodecapole element, and in which FIG. 7a shows a case where electric fields of 3-fold symmetry are produced and FIG. 7b shows a case where electric fields of 6-fold symmetry are produced;

FIG. 10 is a Ronchigram obtained by passing an electron beam through two stages of multipole elements each having a thickness along the optical axis.

DESCRIPTION OF THE PREFERRED EMBODIMENTS

Principle of Operation

Figure 1:
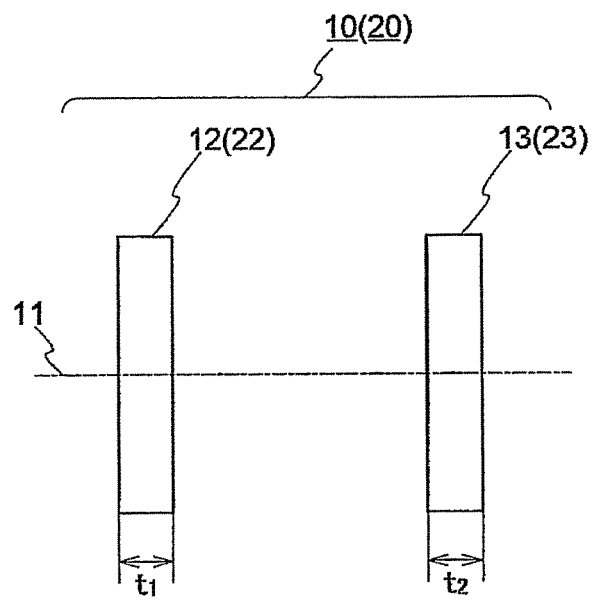
FIG. 1 is a schematic representation of one example of a configuration of the aberration corrector, according to the present invention.

An optical system composed of two stages of multipole elements and an objective lens is now discussed. The two stages of multipole elements produce magnetic or electric fields of 3-fold symmetry or their superimposition. In this optical system, 6-fold astigmatism and 3-fold astigmatism produced by the two stages of multipole elements have a relationship given by $$A_6 = \frac{A_3^2 |A_3|^2}{14 M^6 f^6} t^7 \tag{1}$$

where $A_6$ is a 6-fold astigmatism coefficient per unit length, $A_3$ is a 3-fold astigmatism coefficient per unit length, M is a demagnification factor achieved by the two stages of multipole elements and objective lens, t is the thickness of each multipole element taken along the optical axis, and f is the focal length of the objective lens. Let $a_3$ be the strength of 3-fold astigmatism. Let $\theta_{a3}$ be the azimuthal angle of 3-fold astigmatism. The 3-fold astigmatism coefficient $A_3$ can be represented by $$A_3 = a_3 \exp(3i\theta_{a3}) \tag{2}$$

and so it can be seen that there exists a certain angular relationship between the 3-fold astigmatism coefficient $A_3$ and 6-fold astigmatism coefficient $A_6$, the relationship being given by $$A_6 \propto (a_3)^4 \exp(6i\theta_{a3}) \tag{3}$$

That is, we take notice of variations in the coefficients $A_3$ and $A_6$ when the azimuthal angle $\theta_{a3}$ of 3-fold astigmatism is varied. Six-fold astigmatisms are produced all about the origin (i.e., about the optical axis) at twice closer intervals than the intervals of the produced 3-fold astigmatisms. Consequently, 6-fold astigmatisms can be corrected or reduced if magnetic fields producing 6-fold astigmatisms at twice closer intervals than magnetic fields producing 3-fold astigmatisms without any phase relationship therebetween (i.e., with no phase difference) are used. Accordingly, a dodecapole element is used as a multipole element producing both types of magnetic fields. Six-fold astigmatisms can be corrected or reduced by using 6 poles of the dodecapole element to produce 3-fold astigmatisms and using all the 12 poles to produce 6-fold astigmatisms. Both types of magnetic fields can be produced by a combination of exciting coils mounted at the poles of the dodecapole element as described later.

The magnetic fields may be replaced by electric fields. Alternatively, each of the magnetic fields may be a superimposition of a magnetic field and an electric field. Where the electric fields are set up, each pole of the dodecapole element acts as an electrode. Where superimposed electric and magnetic fields are produced, each pole is used in combination with an exciting coil such that each pole acts as a magnetic pole and an electrode. As a result, the same advantages can be obtained as where only magnetic fields are used.

Embodiments of the present invention are hereinafter described with reference to the drawings. In each of the following embodiments, an aberration corrector of the present invention is assumed to be used in a transmission electron microscope that is one type of charged-particle beam system.

First Embodiment

Figure 2:
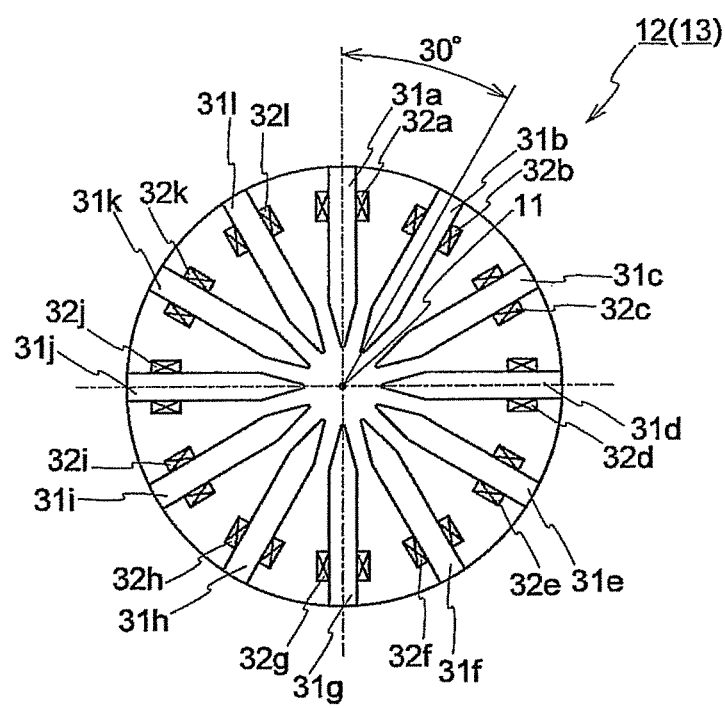
FIG. 2 is a schematic representation of a dodecapole element associated with a first embodiment of the present invention.
Figures 4A, 4B, 4C, 4D:
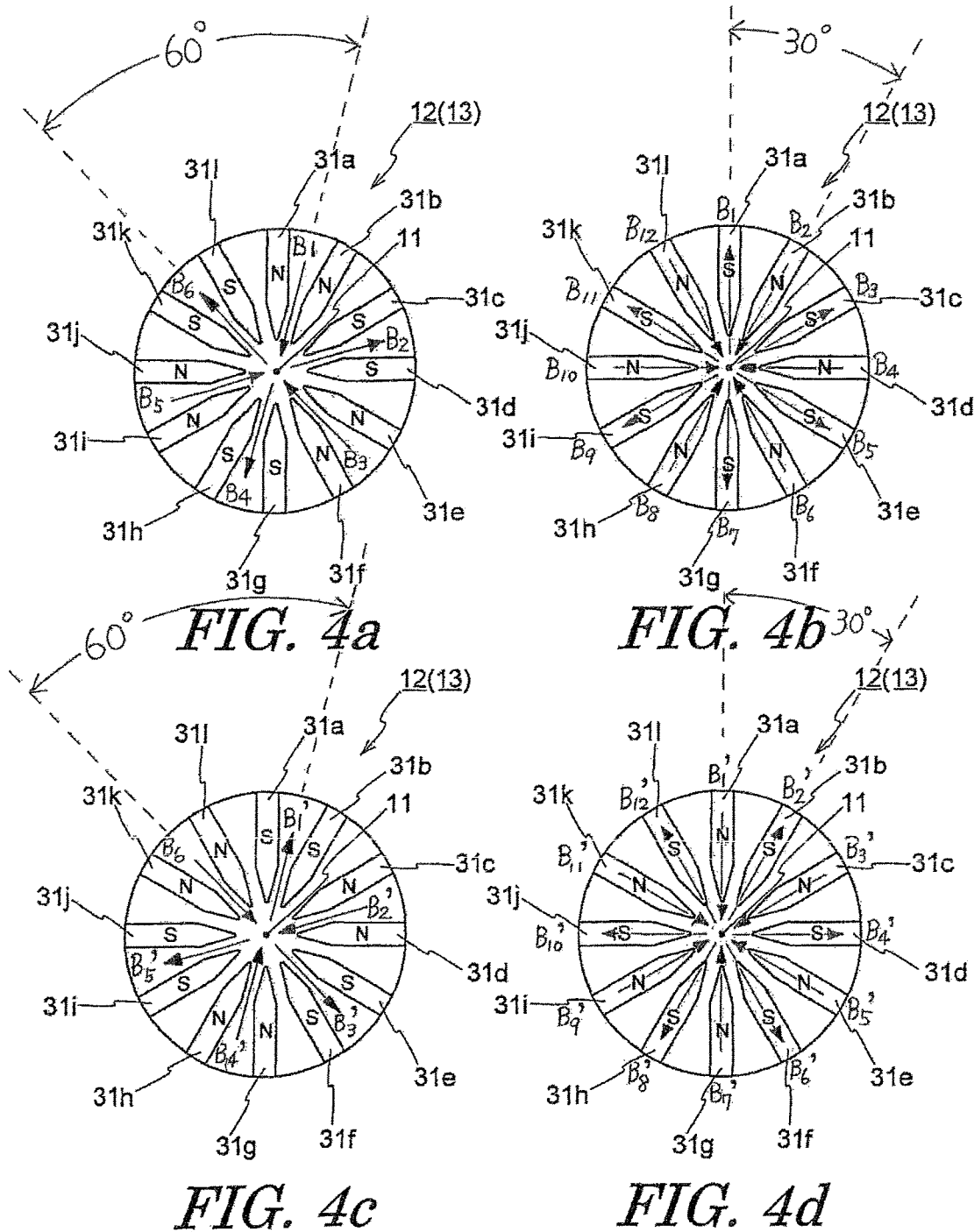

FIG. 1 is a schematic representation of one example of configuration of the aberration corrector, according to the present invention. FIG. 2 is a schematic representation of a dodecapole element associated with a first embodiment of the present invention. FIGS. 3a and 3b show electric circuits associated with the first embodiment of the present invention. FIGS. 4a, 4b, 4c, and 4d show diagrams showing the polarities of the poles of the dodecapole element associated with the first embodiment of the present invention when the dodecapole element is excited. FIGS. 4a and 4c show cases where magnetic fields of 3-fold symmetry are produced. FIGS. 4b and 4d show cases where magnetic fields of 6-fold symmetry are produced.

Referring to FIG. 1, the aberration corrector 10 of the present embodiment has two stages of dodecapole elements 12 and 13 arrayed along the optical axis 11 of an electron beam. The dodecapole elements 12 and 13 have thicknesses of $t_1$ and $t_2$, respectively, taken in the direction of the optical axis. The thicknesses may be identical or different.

More specifically, as shown in FIG. 2, each of the dodecapole elements 12 and 13 has 12 poles 31a-31l arranged radially about the optical axis 11. That is, the poles 31a-31l are spaced from each other about the optical axis 11 at intervals of 30°. Exciting coils 32a-32l are arranged on the poles, respectively, to produce static magnetic fields of 3-fold symmetry about the optical axis 11, as well as static magnetic fields of 6-fold symmetry superimposed on the fields of 3-fold symmetry.

One example of the wire connection of each exciting coil is shown in FIGS. 3a and 3b. As shown in FIG. 3a, the exciting coils 32a, 32d, 32e, 32h, 32i, and 32l are connected in series with a power supply 33 to form a circuit 35. The exciting coils 32a, 32e, and 32i produce magnetic fields $B_1$, $B_5$, and $B_9$ which are identical in sense relative to the optical axis 11 and in strength within a plane perpendicular to the optical axis 11. Because the poles 31a-31l are arranged about the optical axis 11 at intervals of 30°, the magnetic fields $B_1$, $B_5$, and $B_9$ are distributed at intervals of 120° about the optical axis 11 within the plane perpendicular to the optical axis 11.

Similarly, the exciting coils 32d, 32h, and 32l produce magnetic fields $B_4$, $B_8$, and $B_{12}$ which are identical in sense relative to the optical axis 11 and in strength within the plane perpendicular to the optical axis 11. However, the fields $B_4$, $B_8$, and $B_{12}$ are opposite in sense to the magnetic fields $B_1$, $B_5$, and $B_9$ produced by the exciting coils 32a, 32e, and 32i. Where the arrangement of the poles 31a-31l is taken into consideration, it follows that the magnetic fields $B_4$, $B_8$, and $B_{12}$ are distributed at intervals of 120° about the optical axis 11 within the plane perpendicular to the axis 11.

That is, in the circuit 35 shown in FIG. 3a, the senses of the magnetic fields produced by the exciting coils are alternately faced away from the optical axis 11 in the plane perpendicular to the optical axis 11. The power supply 33 is of the bipolar output type capable of varying the direction of current at will.

Similarly, as shown in FIG. 3b, exciting coils 32b, 32c, 32f, 32g, 32j, and 32k are connected in series with a power supply 34 to form a circuit 36. The exciting coils 32b, 32f, and 32j produce magnetic fields $B_2$, $B_6$, and $B_{10}$, respectively, which are identical in sense relative to the optical axis 11 and in strength within the plane perpendicular to the optical axis 11. Where the arrangement of the poles 31a-31l are taken into consideration, the magnetic fields $B_2$, $B_6$, and $B_{10}$ are distributed at intervals of 120° about the optical axis 11 within the plane perpendicular to the axis 11. Similarly, the exciting coils 32c, 32g, and 32k develop magnetic fields $B_3$, $B_7$, and $B_{11}$ that are identical in sense relative to the optical axis 11 and in strength within the plane perpendicular to the optical axis 11 but the fields $B_3$, $B_7$, and $B_{11}$ are opposite in sense to the magnetic fields $B_2$, $B_6$, and $B_{10}$ produced by the exciting coils 32b, 32f, and 32j. Where the arrangement of the poles 31a-31l is taken into consideration, it follows that the magnetic fields $B_3$, $B_7$, and $B_{11}$ are distributed at intervals of 120° about the optical axis 11 within the plane perpendicular to the axis 11.

That is, in the circuit shown in FIG. 3b, the senses of the magnetic fields produced by the exciting coils are alternately faced away from the optical axis 11. The power supply 34 is of the bipolar output type capable of varying the direction of current at will. As described so far, each of the dodecapole elements 12 and 13 are made of the two circuits 35 and 36.

The senses of the magnetic fields shown in FIGS. 3a and 3b depend on the directions of the currents flowing from the power supplies 33 and 34. Therefore, it is obvious that magnetic fields opposite in sense to those shown in FIGS. 3a and 3b can be produced.

In summary, it is assumed that each of the dodecapole elements 12 and 13 has a reference pole such as pole 31a. This reference pole is referred to as the first pole. The dodecapole element has first through twelfth poles arranged in this order. An integer n is assumed to be variable from 0 to 2 (i.e., n=0, 1, 2). The exciting coils of the (4n+1)th poles and the exciting coils of the (4n+4)th poles are alternately connected in series and produce magnetic fields which are identical in absolute value but opposite in sense relative to the optical axis within the plane perpendicular to the optical axis. The exciting coils of the (4n+3)th poles and the exciting coils of the (4n+2)th poles are alternately connected in series and produce magnetic fields which are identical in absolute value but mutually opposite in sense relative to the optical axis within the plane perpendicular to the axis.

As described previously, in the circuits 35 and 36, each exciting coil is not connected with a separate power supply but energized by a common power supply. In the plane perpendicular to the optical axis 11, magnetic fields that are identical in sense relative to the optical axis 11 and in strength are produced at intervals of 120° about the optical axis 11. Because of this 3-fold symmetry, if the power supply output lacks stability, non-rotationally symmetric shapes of the electron beam rarely appear. That is, the shape of the electron beam is stabilized.

The dodecapole elements 12 and 13 having such circuits can produce the magnetic fields of 3-fold symmetry and the magnetic fields of 6-fold symmetry at the same time. For example, as shown in FIG. 4a, the circuit 35 is electrically energized such that the poles 31a, 31e, and 31i are polarized north. Then, the poles 31d, 31h, and 31l are polarized south. The circuit 36 is electrically energized so that the poles 31b, 31f, and 31j are polarized north. Consequently, the poles 31c, 31g, and 31k are polarized south. As a result, magnetic poles (NNSSNNSSNNSS) are arranged in turn from the pole 31a to pole 31l about the optical axis 11. As a consequence, magnetic fields of 3-fold symmetry are produced.

Under this condition, the direction of the current flowing through the circuit 35 is reversed. The poles 31a, 31e, and 31i are polarized south. The poles 31d, 31h, and 31l are polarized north. Accordingly, the magnetic poles (SNSNSNSNSNSN) are arrayed in order from the pole 31a to pole 31l around the optical axis 11 as shown in FIG. 4b. Consequently, magnetic fields of 6-fold symmetry are produced.

The polarities of the magnetic fields of 3-fold symmetry can be reversed. In other words, the magnetic fields of 3-fold symmetry are rotated through 60° about the optical axis 11. In this case, the circuit 35 is electrically energized so that the poles 31a, 31e, and 31i are polarized south. Then, the poles 31d, 31h, and 31l are polarized north. The circuit 36 is electrically energized so that the poles 31b, 31f, and 31j are polarized south. Then, the poles 31c, 31g, and 31k are polarized north. Accordingly, the magnetic poles (SSNNSSNNSSNN) are arrayed in turn from the poles 31a to the pole 31l around the optical axis 11. Magnetic fields of 3-fold symmetry having polarities opposite to the foregoing polarities are produced as shown in FIG. 4c. Under this condition, the circuit 35 is energized with an electrical current in the opposite direction. Magnetic poles (NSNSNSNSNSNS) arrayed from the pole 31a to the pole 31l as shown in FIG. 4d are produced. These are magnetic fields of 6-fold symmetry having polarities opposite to the foregoing polarities. In other words, the aforementioned magnetic fields of 6-fold symmetry are rotated through 30°.

In this structure, the 6-fold astigmatism can be corrected without rotating the dodecapole element 12 or 13 about the optical axis 11. At the same time, positive spherical aberration produced in the objective lens can be corrected.

Figure 8:
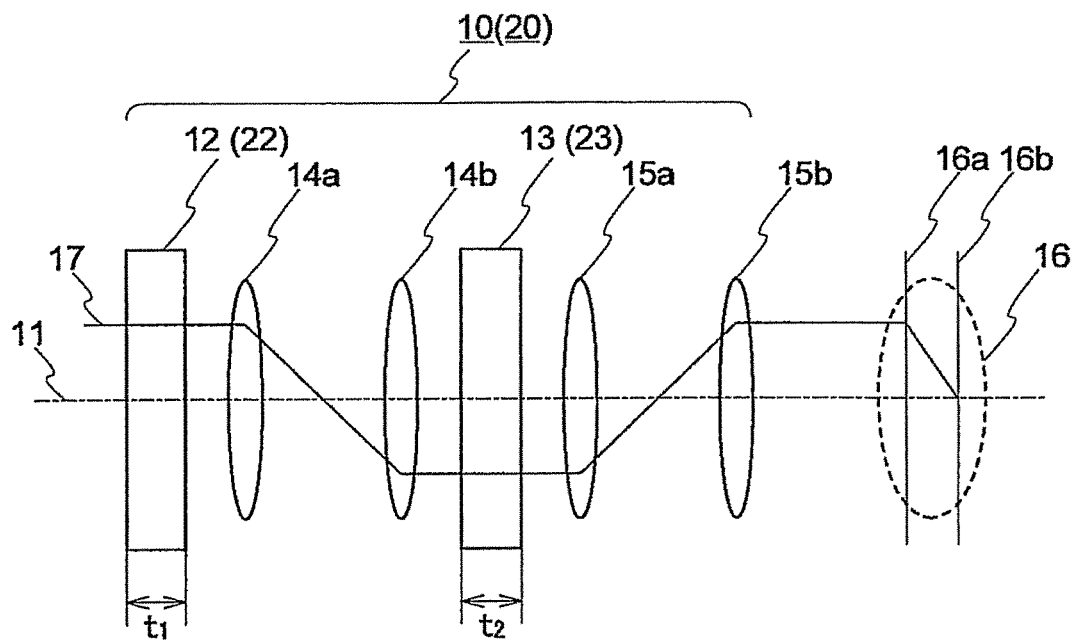
FIG. 8 shows a modification of the aberration corrector of the present invention.

In the aberration corrector 10, transfer lenses 14a and 14b of a pair having transfer magnification of 1:1 may be mounted between the dodecapole elements 12 and 13 as shown in FIG. 8. Transfer lenses 15a and 15b of a pair having transfer magnification of 1:1 may be mounted between an objective lens 16 and the dodecapole element 13.

The transfer lenses 14a and 14b of the pair transfer a reciprocal space image of an electron beam 17 formed in the dodecapole element 12 to the dodecapole element 13. Furthermore, the transfer lenses 15a and 15b of the pair transfer the reciprocal space image of the electron beam 17 appearing in the dodecapole element 13 to a coma-free plane 16a of the objective lens. This plane is substantially identical with the front focal plane of the objective lens. The reciprocal space image transferred to the coma-free plane 16a becomes a real space image on a sample surface 16b of the objective lens.

Also, in this configuration, positive spherical aberration in the objective lens is canceled out by negative spherical aberration in the 3-fold symmetric magnetic fields produced by the dodecapole elements 12 and 13. Therefore, the real space image of the electron beam 17 at the sample surface 16b is not affected by the spherical aberration. Furthermore, 6-fold astigmatism is also reduced by the 6-fold symmetric magnetic fields produced by the dodecapole elements 12 and 13.

Second Embodiment

Figure 6A:
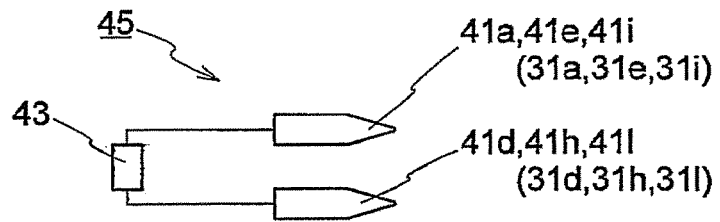
FIGS. 6a and 6b show electric circuits associated with the second embodiment of the present invention.
Figure 6B:
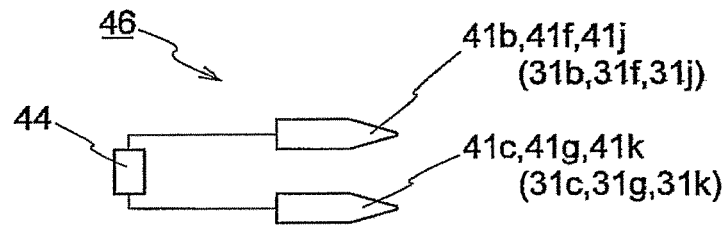

A second embodiment of the present invention is described. FIG. 5 is a schematic representation of a dodecapole element associated with the second embodiment of the present invention. FIGS. 6a and 6b show electric circuits associated with the second embodiment of the present invention. FIGS. 7a and 7b show diagrams showing the polarities of the poles of the dodecapole element associated with the second embodiment of the present invention when voltages are applied to the dodecapole element. FIG. 7a shows a case where electric fields of 3-fold symmetry are produced, and FIG. 7b shows a case where electric fields of 6-fold symmetry are produced.

An aberration corrector 20 associated with the second embodiment of the present invention has two stages of dodecapole elements 22 and 23 arrayed along the optical axis 11 of an electron beam as shown in FIG. 1. The dodecapole elements 22 and 23 have thicknesses of t1 and t2, respectively, taken in the direction of the optical axis. The thicknesses may be identical or different.

The dodecapole elements 22 and 23 associated with the present embodiment are arranged relative to the optical axis 11 in the same way as in the first embodiment as shown in FIG. 1. The configuration is more particularly shown in FIG. 5, where poles 41a-41l are arranged radially about the optical axis 11. The poles 41a-41l are arranged at intervals of 30° about the optical axis 11.

In each of the dodecapole elements 22 and 23, a power supply 43 or 44 is connected with each of the poles 41a-41l, and a voltage is applied to each pole. As described later, static electric fields of 3-fold symmetry and static magnetic fields of 6-fold symmetry are produced about the optical axis 11, the latter fields being superimposed on the former fields.

One example of wire connection of each pole is shown in FIGS. 6a and 6b. As shown in FIG. 6a, the three poles 41a, 41e, and 41i are connected to one output of the power supply 43. The three poles 41d, 41h, and 41l are connected with the other output of the power supply 43. Thus, a circuit 45 is formed. Accordingly, the poles 41a, 41e, and 41i are at equipotential and produce electric fields that are identical in sense relative to the optical axis 11 and in strength within the plane perpendicular to the optical axis 11. Similarly, the poles 41d, 41h, and 41l are at equipotential and produce magnetic fields that are identical in sense relative to the optical axis 11 and in strength within the plane perpendicular to the axis 11. However, their polarities are opposite to the senses of the electric fields produced by the poles 41a, 41e, and 41i. That is, in the circuit 45 shown in FIG. 6a, the senses of the electric fields produced by the poles are alternately faced away from the optical axis 11 within the plane perpendicular to the optical axis 11. The power supply 43 is of the bipolar output type capable of varying the direction of output at will.

Similarly, as shown in FIG. 6b, poles 41b, 41c, 41f, 41g, 41j, and 41k are connected in series with the power supply 44 to form a circuit 46. The poles 41b, 41f, and 41j produce magnetic fields that are identical in sense relative to the optical axis 11 and in strength within the plane perpendicular to the axis 11. On the other hand, the poles 41c, 41g, and 41k produce magnetic fields which are identical in sense relative to the optical axis 11 and in strength within the plane perpendicular to the axis 11. The senses of the magnetic fields are opposite to the senses of the magnetic fields produced by the poles 41b, 41f, and 41j. That is, in the circuit shown in FIG. 6b, the senses of the magnetic fields produced by the poles are alternately faced away from the optical axis 11 within the plane perpendicular to the axis. The power supply 44 is of the bipolar output type capable of varying the polarity of the output voltage at will. As described so far, each of the dodecapole elements 22 and 23 is made up of the two circuits 45 and 46.

In summary, it is assumed that each of the dodecapole elements 22 and 23 has a reference pole such as pole 41a. This reference pole is referred to as the first pole. The dodecapole element has first through twelfth poles arranged in this order. An integer s is assumed to be variable from 0 to 2 (i.e., s=0, 1, 2). The (4s+1)th poles are all electrically connected. Also, the (4s+4)th poles are all electrically connected. The (4s+1)th poles and the (4s+4)th poles produce electric fields which are identical in absolute value but mutually opposite in sense relative to the optical axis 11 within the plane perpendicular to the axis 11. That is, the potentials at the (4s+1)th and (4s+4)th poles are identical in absolute value but different in polarity. The (4s+2)th poles are all electrically connected. Also, the (4s+3)th poles are all electrically connected. The (4s+2)th poles and the (4s+3)th poles produce electric fields which are identical in absolute value but mutually opposite in sense relative to the optical axis 11 within the plane perpendicular to the axis 11. That is, the potentials at the (4s+2)th and (4s+3)th poles are identical in absolute value but different in polarity.

As described previously, in the circuits 45 and 46, each pole is not connected with a separate power supply but applied with a voltage from a common power supply. Electric fields that are identical in sense and strength are produced at intervals of 120° about the optical axis 11. Because of this 3-fold symmetry, if the power supply output lacks stability, non-rotationally symmetric shapes of the electron beam rarely appear. That is, the shape of the electron beam is stabilized.

The dodecapole elements 22 and 23 having such circuits can produce the electric fields of 3-fold symmetry and the electric fields of 6-fold symmetry at the same time. For example, as shown in FIG. 7a, voltages are applied such that the poles 41a, 41e, and 41i are polarized positively (+) and that the poles 41d, 41h, and 41l are polarized negatively (−). Furthermore, voltages are applied such that the poles 41b, 41f, and 41j are polarized positively (+) and that the poles 41c, 41g, and 41k are polarized negatively (−). As a result, electrodes of (++−−++−−++−−) are arranged in turn from the pole 41a to the pole 41l around the optical axis 11. Hence, electric fields of 3-fold symmetry are produced.

Under this condition, the output polarity of the power supply 43 is reversed. The poles 41a, 41e, and 41i are polarized negatively (−). The poles 41d, 41h, and 41l are polarized positively (+). Accordingly, the electrodes of (−+−+−+−+−+−+) are arrayed in turn from the pole 41a to pole 41l around the optical axis 11 as shown in FIG. 7b. Consequently, electric fields of 6-fold symmetry are produced.

The polarities of the electric fields of 3-fold symmetry can be reversed. In other words, the electric fields of 3-fold symmetry are rotated through 60° about the optical axis 11. In this case, voltages are applied such that the poles 41a, 41e, and 41i are polarized negatively (−) and that the poles 41d, 41h, and 41l are polarized positively (+). Furthermore, voltages are applied such that the poles 41b, 41f, and 41j are polarized negatively (−) and that the poles 41c, 41g, and 41k are polarized positively (+). Electrodes of (−−++−−++−−++) are arrayed in turn from the pole 41a to the pole 41l around the optical axis 11. Electric fields of 3-fold symmetry of the polarities opposite to the polarities shown in FIG. 7a are produced. Under this condition, if the output polarity of the power supply 43 is reversed, polarities +−+−+−+−+−+− are arrayed in turn from the pole 41a to the pole 41l. Electric fields of 6-fold symmetry of the polarities opposite to the polarities shown in FIG. 7b are produced. As a result, electric fields of 6-fold symmetry having the polarities opposite to the polarities of the foregoing fields are produced. In other words, the aforementioned electric fields of 6-fold symmetry are rotated through 30°.

In this configuration, the 6-fold astigmatism can be corrected without rotating the dodecapole element 12 or 13 about the optical axis 11. At the same time, positive spherical aberration produced in the objective lens can be corrected.

In the aberration corrector 20, transfer lenses 14a and 14b of a pair having transfer magnification of 1:1 may be mounted between the dodecapole elements 22 and 23 as shown in FIG. 8. Transfer lenses 15a and 15b of a pair having transfer magnification of 1:1 may be mounted between the objective lens 16 and dodecapole element 23, in the same way as in the first embodiment.

Third Embodiment

A third embodiment of the present invention is a combination of the aberration corrector 10 of the first embodiment and the aberration corrector 20 of the second embodiment. Two stages of dodecapole elements for producing magnetic and electric fields of 3-fold symmetry and magnetic and electric fields of 6-fold symmetry are produced around the optical axis 11 to correct 6-fold astigmatism and spherical aberration.

More specifically, the power supplies 43 and 44 shown in FIGS. 6a and 6b are connected with the poles 31a-31l of the dodecapole elements 12 and 13 (see FIGS. 1 and 2) described in the first embodiment. Consequently, the magnetic fields of 3-fold symmetry and 6-fold symmetry described in the first embodiment and the electric fields of 3-fold symmetry and 6-fold symmetry described in the second embodiment can be superimposed. Hence, advantages identical with the advantages of the first and second embodiments can be gained.

The two magnetic fields and the two electric fields can have any desired rotational symmetry. The poles with which the power supplies 43 and 44 are connected are not limited to the poles shown in FIGS. 6a and 6b.

That is, each of the dodecapole elements 12 and 13 of the first embodiment has first through twelfth poles arranged in this order. Any desired pole (such as pole 31a) is referred to as the first pole. An integer m is assumed to be variable from 0 to 2 (i.e., m=0, 1, 2). The (4m+1)th poles are all electrically connected. The (4m+4)th poles are all electrically connected. The (4m+1)th and (4m+4)th poles produce electric fields which are identical in absolute value but mutually opposite in sense relative to the optical axis within the plane perpendicular to the axis. That is, the potentials at the (4m+1)th poles and at the (4m+4)th poles are identical in absolute value but different in polarity. The (4m+2)th poles are all electrically connected. The (4m+3)th poles are all electrically connected. The (4m+2)th and (4m+3)th poles produce electric fields which are identical in absolute value but mutually opposite in sense relative to the optical axis within the plane perpendicular to the optical. That is, the potentials at the (4m+2)th and (4m+3)th poles are identical in absolute value but different in polarity.

In addition, the two pairs of transfer lenses 14a, 14b, 15a, 15b described in the first and second embodiments may be mounted (see FIG. 8). As a result, advantages identical with the advantages of the first and second embodiments can be obtained.

Fourth Embodiment

Figure 9:
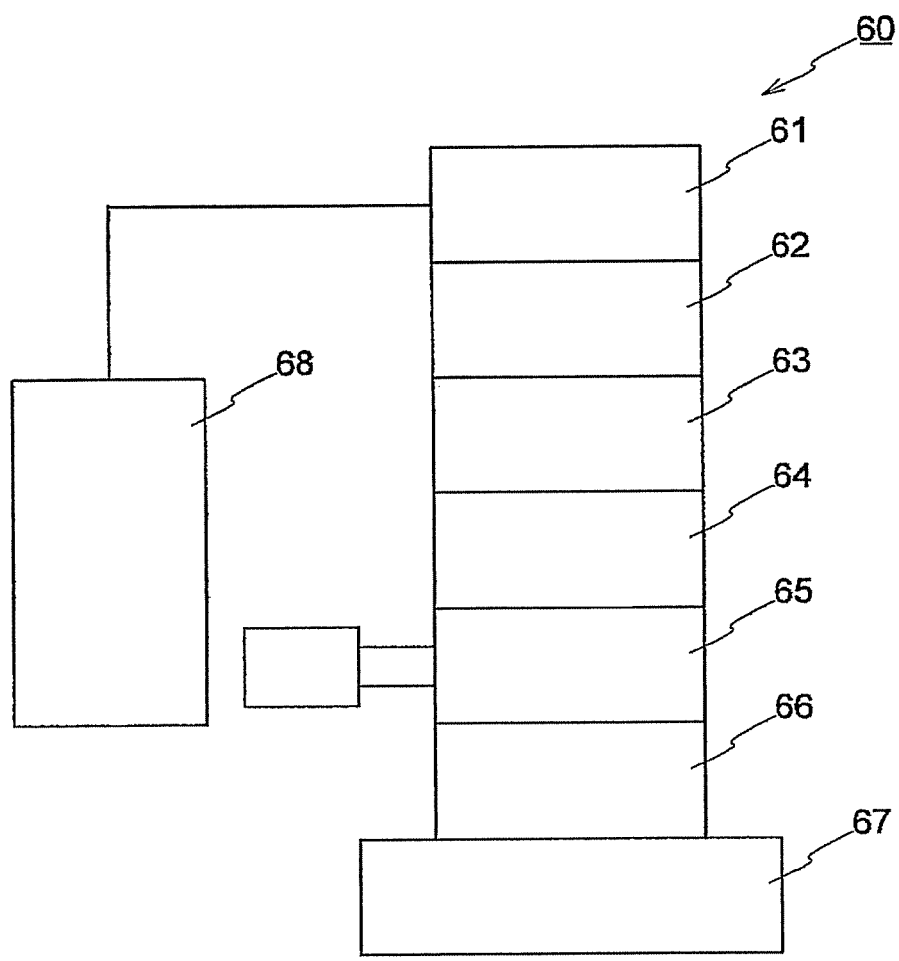
FIG. 9 is a schematic block diagram of a transmission electron microscope equipped with an aberration corrector associated with the present invention.

A fourth embodiment of the present invention is described. FIG. 9 shows one example of a charged-particle beam system associated with the fourth embodiment. This system is a transmission electron microscope 60 in which an aberration corrector associated with any one of the first through third embodiments is used as an aberration corrector 63 of the illumination system.

The microscope has an electron gun 61 producing an electron beam (not shown) and accelerating it to a desired energy under control of a high-voltage control portion 68. The accelerated electron beam is converged by a first condenser lens 62 and a second condenser lens 64. The beam is further converged in an objective lens and sample stage 65 and directed at a sample placed on the sample stage.

The aberration corrector 63 of the illumination system mounted between the first condenser lens 62 and the second condenser lens 64 produces magnetic or electric fields of 3-fold symmetry and magnetic or electric fields of 6-fold symmetry, the latter fields being superimposed on the former fields. As mentioned previously, this aberration corrector has negative spherical aberration and so cancels out positive spherical aberration induced by the objective lens. Furthermore, 6-fold astigmatism is corrected.

The electron beam transmitted through the sample is magnified by an intermediate projector lens 66 and made to impinge on a fluorescent screen (not shown) in an observation chamber 67. The sample image projected onto the fluorescent screen is captured by a camera or other device.

Because the spherical aberration and 6-fold astigmatism are corrected by the aberration corrector 63 of the illumination system, the spatial resolution of the transmission electron microscope 60 is improved.

The aberration correction using the aberration corrector 63 of the illumination system extends the range of incident angles of the electron beam in which aberrations can be corrected. If the range of angles of the electron beam is extended, diffraction aberration due to an aperture (not shown) is reduced. Therefore, the spatial resolution of the transmission electron microscope is improved further.

In the structure described above, instead of the aberration corrector 63 of the illumination system, an aberration corrector (not shown) of similar structure may be mounted behind the objective lens. Alternatively, both aberration correctors may be installed.

The aberration corrector of the present invention can be installed in every type of charged-particle beam system in which spherical aberration and 6-fold astigmatism are required to be corrected. The aberration corrector can be installed in a scanning electron microscope, scanning transmission electron microscope, ion microscope, focused ion beam system, and so on, as well as in the above-described transmission electron microscope.

Having thus described our invention with the detail and particularity required by the Patent Laws, what is desired protected by Letters Patent is set forth in the following claims.

The invention claimed is:

1. An aberration corrector for a charged-particle beam, comprising:
    two stages of magnetic dodecapole elements, each of the dodecapole elements having first through twelfth poles arranged in this numerical order; and
    exciting coils mounted at the poles, respectively, of each of the dodecapole elements,
    wherein the exciting coils of the (4n+1)th poles having a common polarity and the exciting coils of the (4n+4)th poles having a different common polarity are connected in a first series circuit (where n=0, 1, 2) with a first reversible power supply and produce magnetic fields which are identical in absolute value but alternately opposite in polarity, and
    wherein the exciting coils of the (4n+3)th poles having a common polarity and the exciting coils of the (4n+2)th poles having a different common polarity are connected in a second series circuit with a second reversible power supply and produce magnetic fields which are identical in absolute value but alternately opposite in polarity,
    whereby selection of the polarities of the first and second reversible power supplies enables multipole elements to produce magnetic fields of 3-fold symmetry in two orientations 60 degrees apart or multipole elements to produce magnetic fields of 6-fold symmetry in two orientations 30 degrees apart.

2. An aberration corrector as set forth in claim 1,
    wherein each pole of said magnetic dodecapole elements acts also as an electric dodecapole element,
    wherein the (4m+1)th poles are all electrically connected (where m=0, 1, 2),
    wherein the (4m+2)th poles are all electrically connected,
    wherein the (4m+3)th poles are all electrically connected,
    wherein the (4m+4)th poles are all electrically connected,
    wherein the (4m+1)th poles and the (4m+4)th poles connected to opposite polarity outputs of a first reversible bipolar power supply produce electric fields which are identical in absolute value but opposite in polarity, and
    wherein the (4m+2)th poles and the (4m+3)th poles connected to opposite polarity outputs of a second reversible bipolar power supply produce electric fields which are identical in absolute value but opposite in polarity,
    whereby selection of the polarities of the first and second reversible bipolar power supplies enables multipole elements to produce electric fields of 3-fold symmetry in two orientations 60 degrees apart or multipole elements to produce electric fields of 6-fold symmetry in two orientations 30 degrees apart.

3. An aberration corrector for a charged-particle beam, comprising:
    two stages of electric dodecapole elements, each of the dodecapole elements having first through twelfth poles arranged in this numerical order;

wherein the (4s+1)th poles are all electrically connected in a first circuit (where s=0, 1, 2);

wherein the (4s+2)th poles are all electrically connected in a second circuit;

wherein the (4s+3)th poles are all electrically connected in a third circuit;

wherein the (4s+4)th poles are all electrically connected in a fourth circuit;

wherein the first and fourth circuits connected to opposite outputs of a first reversible bipolar power supply produce electric fields which are identical in absolute value but opposite in polarity, and wherein the second and third circuits connected to opposite outputs of a second reversible bipolar power supply produce electric fields which are identical in absolute value but opposite in polarity, whereby selection of the polarities of the first and second reversible bipolar power supplies enables multipole elements to produce electric fields of 3-fold symmetry in two orientations 60 degrees apart or multipole elements to produce electric fields of 6-fold symmetry in two orientations 30 degrees apart.

4. A charged-particle beam system equipped with the aberration corrector set forth in claim 1.

5. A charged-particle beam system equipped with the aberration corrector set forth in claim 2.

6. A charged-particle beam system equipped with the aberration corrector set forth in claim 3.

* * * * *